United States Patent
Ohkawa

(10) Patent No.: US 7,701,043 B2
(45) Date of Patent: Apr. 20, 2010

(54) LEAD FRAME

(75) Inventor: Shinya Ohkawa, Kagoshima-Ken (JP)

(73) Assignee: Yamaha Corporation, Shizuoka-ken (JP)

( * ) Notice: Subject to any disclaimer, the term of this patent is extended or adjusted under 35 U.S.C. 154(b) by 61 days.

(21) Appl. No.: 11/859,500

(22) Filed: Sep. 21, 2007

(65) Prior Publication Data
US 2008/0135996 A1 Jun. 12, 2008

(30) Foreign Application Priority Data
Sep. 22, 2006 (JP) .............................. 2006-256971

(51) Int. Cl.
*H01L 23/495* (2006.01)

(52) U.S. Cl. ................ 257/666; 257/676; 257/E23.04; 257/E23.043; 257/E23.046; 257/E23.054; 257/E23.124

(58) Field of Classification Search ................ 257/666, 257/676, E23.04, E23.043, E23.054, E23.046, 257/E23.124
See application file for complete search history.

(56) References Cited

U.S. PATENT DOCUMENTS

| 6,063,139 | A | * | 5/2000 | Fukaya | ...................... 29/25.01 |
| 7,034,382 | B2 | * | 4/2006 | Palmteer et al. | ............. 257/676 |
| 2005/0040512 | A1 | | 2/2005 | Tsubonoya et al. | |
| 2006/0033184 | A1 | * | 2/2006 | Park et al. | .................... 257/666 |

FOREIGN PATENT DOCUMENTS

| JP | 01-308058 | 12/1989 |
| JP | 2005-064076 | 3/2005 |

* cited by examiner

*Primary Examiner*—Long K Tran
(74) *Attorney, Agent, or Firm*—Dickstein Shapiro LLP

(57) ABSTRACT

A connecting tape made of insulating material is adhered between a stage unit 21 and a stage unit 22. The stage units 21 and 22 form united stage units by that. Therefore, edge parts 211 and 221 of the stage units 21 and 22 are bound by the connecting tape 41 and of which movements are restricted. The united stage units 21 and 22 are securely supported by support units 31 and 32 and support units 33 and 34. As a result, number of the support units is reduced and inner lead 12 consumed.

5 Claims, 7 Drawing Sheets

ID FRAME

CROSS REFERENCE TO RELATED APPLICATION

This application is based on Japanese Patent Application 2006-256971, filed on Sep. 22, 2006, the entire contents of which are incorporated herein by reference.

BACKGROUND OF THE INVENTION

A) Field of the Invention

This invention relates to a lead frame to be mounted to a semiconductor chip.

B) Description of the Related Art

For example, a semiconductor chip formed by a photolithography process is packaged via bonding after mounting to a lead frame. Recently a multi-chip package that mounts plurality (two or more) of the semiconductor chips on a single lead frame is widely used. In the multi-chip package, plurality of stage units to be mounted onto these semiconductor chips corresponding to the numbers of the semiconductor chips are equipped (Refer to JPA H01-308058). Each stage unit is supported by a frame unit on the outskirt by a supporting unit for supporting.

When the plurality of the stage units are equipped, there is a risk for each stage unit to be deformed in following processes such as a packaging process, etc. For example, when resin is injected in the packaging process, each stage unit may be buffeted by the flow of the resin. If the stage is buffeted, an electrical damage such as cut in a bonding wire may occur. Therefore, in the multi-chip package, each of two stage units is supported by a supporting unit independently. Moreover, two stage units are connected by a united connection unit to reduce deformation of the stage unit (refer to JPA 2005-64076).

However, when each stage unit is supported by the supporting unit, it is necessary to equip at least a supporting unit extending from each angled part of the stage units to the frame units in order to support the stage units stably. On the other hand, plurality of inner leads to be connected with the semiconductor chips mounted on the stage units are equipped on the frame unit. Therefore, a unit of the inner leads is used as the supporting unit, and the inner leads that can be usable for connecting with the semiconductor chips will decrease. As a result, it may cause large sizing of the frames in order to reserve predetermined number of the inner leads.

Moreover, in the multi-chip package, for example, a signal-type large scale integrated circuit (LSI) driven at a low voltage of about several volts for processing signals and a controlling-type switching element for a controlling system driven by this signal-typed LSI at a high voltage of from about several tens volts to several hundreds volts are mounted on the same lead frame. In this case, difference in electric potentials between the stage unit mounting the signal-typed LSI and the stage unit mounting the controlling-typed switching element becomes large. Therefore, it is necessary to insulate the two stage units. As a result, if the two stage units are connected by a united connection unit as disclosed in JPA 2005-64076, there will be a problem that it is impossible to insulate the two stage units.

SUMMARY OF THE INVENTION

It is an object of the present invention to provide a lead frame that can insulate two or more stage units and stably support the two or more stage units without increasing in a size.

According to one aspect of the present invention, there is provided a leadframe, comprising: a plurality of stage units that are formed separately from each other and are arranged on a same plane or on planes in parallel; a frame unit that is arranged around the stage units; a support unit that connects the stage units with the frame unit and supports the stage units with the frame unit; and a connecting unit that is formed of insulating material and connects the stage units between the stage units.

The plurality of stage units are connected to each other by the connecting unit. Therefore, the connected stage units are united so as to reduce deformation. By that, when the support unit supports a part of each stage unit, that is, when number of the support units is reduced, free deformation of each stage unit is reduced. Therefore, each stage unit is stably supported without making its size large. Moreover, the connecting part is formed of insulating material so that the stage units connected by the connecting unit are insulated. Therefore, insulation between the stage units can be done certainly.

According to another aspect of the present invention, the above-described connecting unit may comprise an adhering part and is adhered to the stage units with the adhering part.

By that, the plurality of stage units can be connected by easy process such as adhering the connecting part, and stability of the stage units can be accomplished without making processes complex.

According to still another aspect of the present invention, the above-described connecting unit may be adhered to a part including an angled part of each of opposing stage units.

The connecting unit fixes only a part of the stage unit which moves largely with deformation. By that the connecting unit does not have to be adhered to all parts between the stage units but the connecting unit only needs to be adhered to a part of the stage units to reduce deformation of the stage units. As a result, for example, when a resin is injected. In a packaging process, the connecting unit unlikely intercepts a flow of the resin. Therefore, processibility will improve.

According to a further aspect of the present invention, the above-described connecting unit may be adhered to an edge part opposing to the support unit on a diagonal line of each stage unit.

In each stage unit the angled part opposing to the part connected to the support unit is a free edge and moves largely when deformed. By connecting the angle parts with the connecting unit, the plurality of the stage units are united and deformation is reduced. Therefore, the plurality of the stage units can be stably supported. Moreover, stress to the connecting unit is reduced by connecting the angle parts of the stage units with the connecting unit. Therefore, peeling off of the connecting unit can be reduced.

According to a further aspect of the present invention, the above-described connecting unit may be fixed to the stage units. By that, stability of the stage units can be accomplished without making processes complex.

BRIEF DESCRIPTION OF THE DRAWINGS

FIG. 1A is a plan view, and FIG. 1B is a cross sectional view cut across the line B-B in FIG. 1A.

FIG. 2A and FIG. 28 are schematic views showing a lead frame according to a second embodiment of the present invention. FIG. 2A is a plan view.

FIG. 3A is a plan view, and FIG. 3B is a cross sectional view from B to B line in FIG. 3A.

FIG. 4A is a plan view, and FIG. 4B is an enlarged view of a main part.

DETAILED DESCRIPTION OF THE PREFERRED EMBODIMENTS

Hereinafter, a plurality of embodiments of the present invention will be explained based on the drawings. Moreover, in the embodiments, same symbols are used for substantially same components, and the explanation for those will be omitted.

Figure 1A:
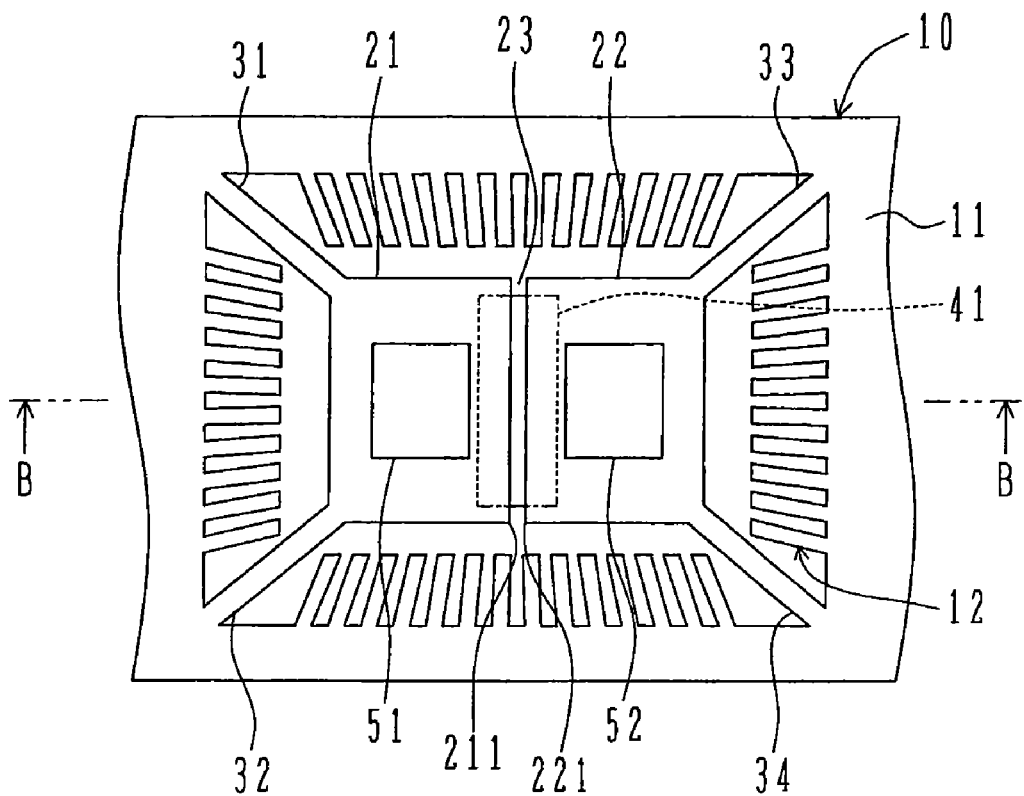
FIG. 1A and FIG. 1B are schematic views showing a lead frame according to a first embodiment of the present invention.
Figure 1B:
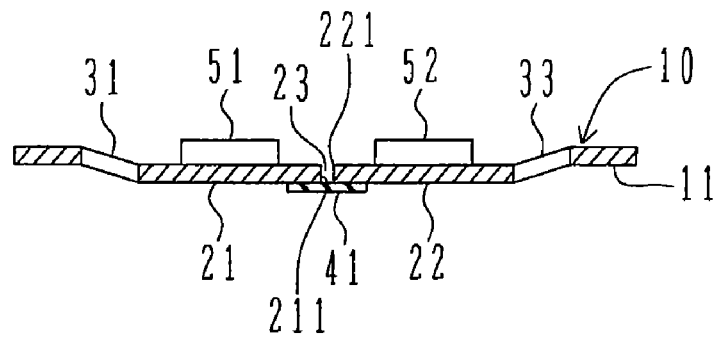

FIG. 1A and FIG. 1B are schematic views showing a lead frame according to a first embodiment of the present invention. A lead frame 10 according to the first embodiment of the present invention shown in FIG. 1 equips with two stage units 21 and 22, a frame unit 11, supporting units 31, 32, 33 and 34, a inner lead 12 and a connecting tape 41 as a connecting unit. The lead frame 10 is formed of conductive metal, for example, copper, brass and aluminum. The lead frame 10 is formed as a belt-typed thin metal plate. A belt-typed thin metal plate that forms the lead frame forms plurality of the lead frames 10 in a longitudinal direction.

The stage units 21 and 22 are placed in the center of the lead frame 10. A frame unit 11 is placed on the outskirt of the stage units 21 and 22. The stage unit 21 is supported by the frame unit 11 by the supporting units 31 and 32 extending from the frame unit 11 to inside. Moreover, the stage unit 22 is supported by the frame unit 11 by the supporting units 33 and 34 extending from the frame unit 11 to inside. The frame unit 11 includes a plurality of inner leads 12 projecting to the stage units 21 and 22. The stage units 21 and 22, the frame unit 11, the supporting units 31, 32, 33 and 34 and the inner lead 12 are unitedly formed of the same thin metal plates. The stage units 21 and 22, the frame unit 11, the supporting units 31, 32, 33 and 34 and the inner lead 12 which compose the lead frame 10 are formed by punching the thin metal plate by a press or by etching the thin metal plate.

Semiconductor chips 51 and 52 are respectively mounted onto the two stage units 21 and 22. An space 23 is formed between the stage unit 21 mounting the semiconductor 51 and the stage unit 22 mounting the semiconductor chip 52. By doing that, the space between the stage unit 21 and the stage 22 are electrically insulated. Many of electric appliances equip with, for example, a semiconductor chip including the LSI for processing the signal according to computer program and a semiconductor chip including a switching element to control electric power system. The semiconductor chip of the signal processing system including the LSI is driven at comparatively low voltage from several milli-volts to several volts. On the other hand, the semiconductor chip of the controlling system including the switching element controls high voltage of several tens of volts to several hundreds of volts supplied from the power supply. Therefore, a large difference in the electric potential is generated between the semiconductor chip of the signal system and the semiconductor chip of the controlling system. A space 23 is formed between the two stage unit 21 and the stage unit 22 in order to insulate the semiconductor chip of the signal system and the semiconductor chip of the controlling system. By that, the plurality of the semiconductor chips which are driven at different voltages or controlling different control target voltages can be mounted onto the same lead frame 10. Moreover, influence of high-frequency noise between the semiconductor chips 51 and 52 which are different in driving frequency or the controlling frequency will be decreased by forming the space 23 formed between the stage unit 21 and the stage unit 22. Moreover, the space may be formed between the stage unit 21 and the stage unit 22 in not only the case that the electric potential between the stage unit 21 and the stage unit 22 is large.

In case of the first embodiment of the present invention, the two stage units 21 and 22 are positioned approximately on the same plane. Therefore, the semiconductor chip 51 mounted on the stage unit 21 and the semiconductor chip 52 mounted on the stage unit 22 are mounted on the approximately same plane. The semiconductor chips 51 and 52 which are mounted on the stage unit 21 and the stage unit 22 are electrically connected with the inner lead 12 in the following bonding process.

A connecting tape 41 is positioned between the stage unit 21 and the stage unit 22. The connecting tape 41 includes, for example, a base composed of resin and an adhering part applied at least on one surface of the base. The base of the connecting tape 41 is formed with resin with high insulation and heat-resistance. The connecting tape 41 certainly connects between the stage unit 21 and the stage unit 22 in a packaging process by forming the base of the connecting tape 41 with the resin with high heat-resistance. For example, polyimide can be used as a material of the connecting tape 41.

An adhering part of the connecting tape 41 adheres to the stage unit 21 and the stage unit 22. By that, the connecting tape 41 is easily adhered to the stage unit 21 and the stage unit 22. The connecting tape 41 is not limited to be composed of the base and the adhering part as described in the above. For example, the material to be the base itself may have adhesive property for the connecting tape 41. By that, the base itself connects the stage unit 21 and the stage unit 22.

In the case of the first embodiment of the present invention, the connecting tape 41 is adhered to an opposing surface of the surface where the semiconductor chip 51 and the semiconductor chip 52 are mounted on the stage unit 21 and the stage unit 22. The stage unit 21 and the stage unit 22 are connected by adhering the connecting tape 41. The stage unit 21 is supported by the supporting units 31 and 32, and the stage unit 22 is supported by the supporting units 33 and 34. Therefore, an edge part 211 of the stage unit 21 and an edge part 221 of the stage unit 22 that form the space 23 and facing each other are free ends. As a result, deforming amount of the stage unit 21 and the stage unit 22 will increase at the edge part 211 and the edge part 221.

Free movement of the stage unit 21 and the stage unit 22 in the plate thickness direction of the edge part 211 and the edge part 221 is restricted by connecting the opposing sides of the supporting units 31 and 32 via the stage unit 21 and the opposing sides of the supporting units 33 and 34 via the stage unit 22 with the connecting tape 41. Therefore, the stage unit 21 and the stage unit 22 form a united stage unit by connecting with the connecting tape 41. For example, in the following packaging process, resin for packaging flows through the space 23 between the stage unit 21 and the stage unit 22. Therefore, the edge part 211 of the stage unit 21 and the edge part 221 of the stage unit 22 which are facing for forming the space 23 tend to deform by the resin flow. On the other hand, in the embodiment of the present invention, the stage unit 21 and the stage unit 22 form a united stage unit as described in the above by being adhered with the connecting tape 41. As a result, movements of the stage unit 21 and the stage unit 22 are restricted by the connecting tape 41 even if resin flows through the space 23, and deformation will decrease.

As described in the above, in the first embodiment of the present invention, the stage unit 21 and the stage unit 22 form a united stage unit by adhering therebetween with the connecting tape 41. Therefore, the edge part 211 and the edge part 221 of the stage unit 21 and the stage unit 22 which are on the opposing side of the supporting units 31 and 32 and the supporting units 33 and 34 are restricted, and free movement is restricted. By that, the united stage unit 21 and the stage unit 22 are supported by the supporting units 31 and 32 and the supporting units 33 and 34. As a result, number of the supporting units can be reduced. By reducing the number of the supporting units, the inner leads 12 which are expended for supporting the stage units 21 and 22 is decreased. Therefore, the stage unit 21 and the stage unit 22 can stably supported without causing large-sizing of the body by increase in the number of the inner leads 12.

Moreover, in the first embodiment of the present invention, the stage unit 21 and the stage unit 22 are connected with the insulating connecting tape 41. Therefore, the stage unit 21 and the stage unit 22 are electrically insulated. By that, even if the semiconductor chips 51 and 52 which are different in the driving voltages and/or the controlling voltages are mounted on the stage unit 21 and the stage unit 22, influence brought to each other can be decreased.

The lead frame according to the second and third embodiments of the present invention are shown in FIG. 2A to FIG. 3B.

Figure 2A:
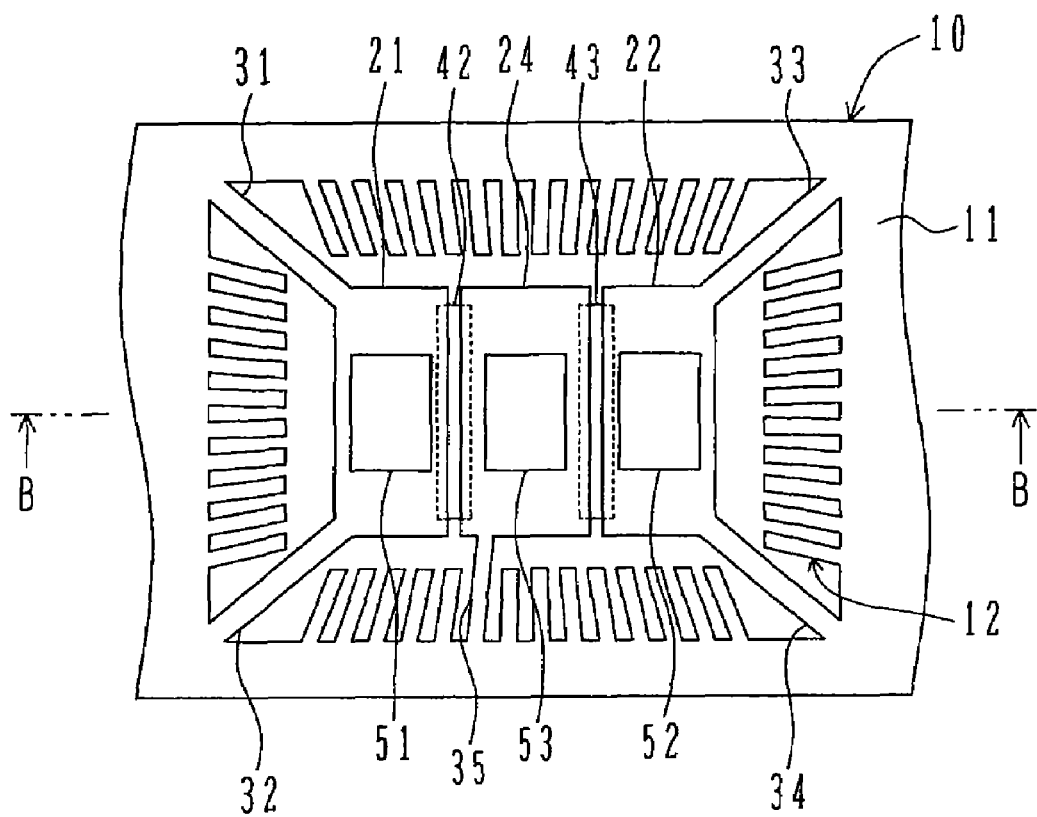
Figure 2B:
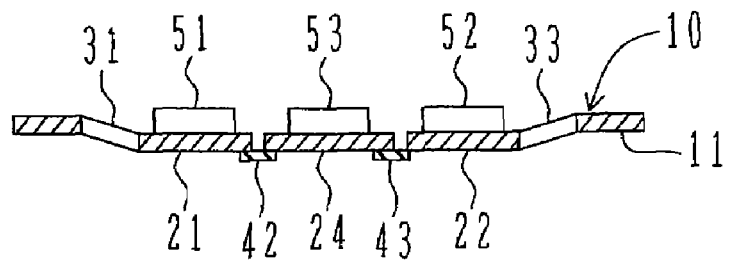
FIG. 2B is a cross sectional view from B to B line in FIG. 2A.

In case of the second embodiment shown in FIG. 2A and FIG. 2B, the lead frame 10 equips with three stage units 21, 22 and 24. The stage unit 21 is supported on the frame unit 11 by the supporting units 31 and 32. The stage unit 22 is supported on the frame unit 11 by the supporting units 33 and 34. The stage unit 24 is supported on the frame unit 11 by the supporting unit 35. The semiconductor chip 51, the semiconductor chip 52 and the semiconductor chip 53 are respectively mounted on the stage unit 21, the stage unit 22 and the stage unit 24.

The stage unit 21 and the stage unit 24 are connected by a connecting tape 42, and the stage unit 24 and the stage unit 22 are connected by a connecting tape 43. By that, the stage unit 21, the stage unit 22 and the stage unit 24 are unitedly connected.

In the second embodiment, deformation of the stage unit 21, the stage unit 22 and the stage unit 24 can be reduced even though the lead frame 10 equips with three stage units 21, 22 and 24.

Figure 3A:
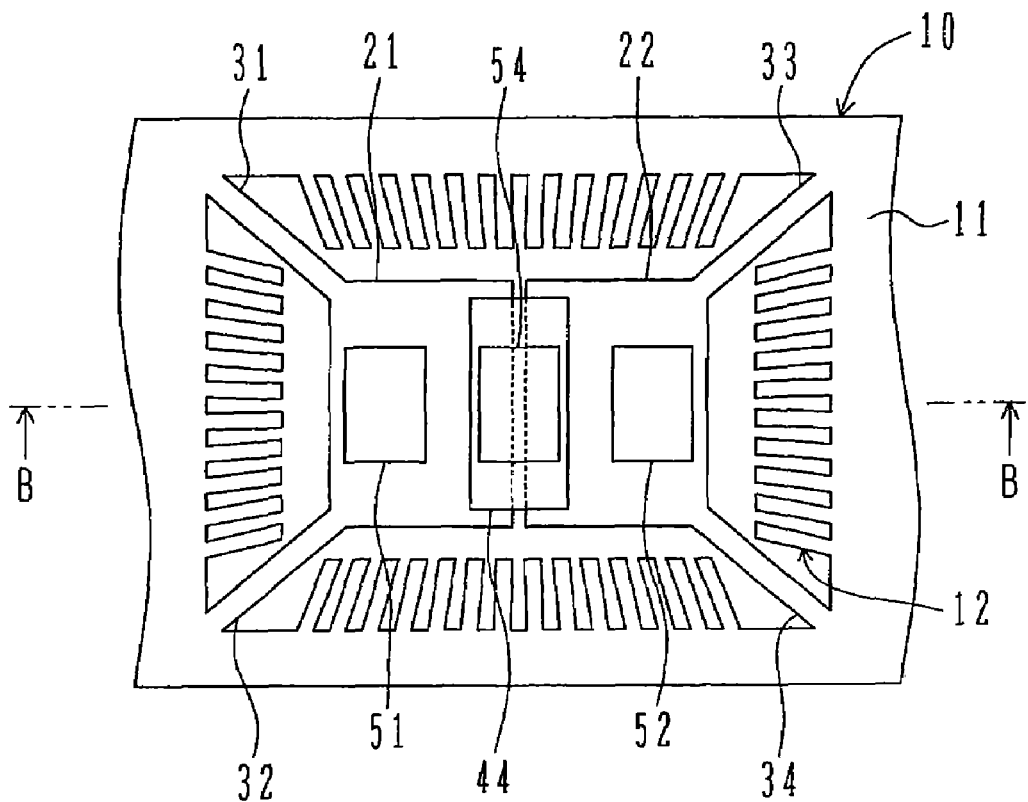
FIG. 3A and FIG. 3B are schematic views showing a lead frame according to a third embodiment of the present invention.
Figure 3B:
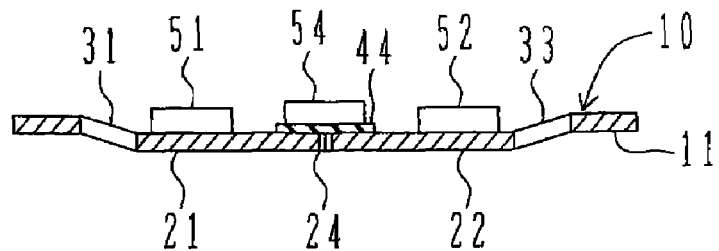

In case of the third embodiment shown in FIG. 3A and FIG. 3B, the lead frame 10 equips with two stage units 21 and 22. The stage unit 21 and the stage unit 22 are connected by a connecting tape 44. In the third embodiment, the connecting tape 44 is adhered on the same surface as the mounting surfaces of the semiconductor chip 51 of the stage unit 21 and of the semiconductor chip 52 of the stage unit 22. Moreover, a semiconductor chip 54 is mounted on the opposing side of the stage unit 21 and the stage unit 22 of the connecting tape 44. That is, the connecting tape 44 has adhesive property on both sides.

In the third embodiment, three semiconductor chips 51, 52 and 54 can be mounted on the lead frame having two stage units 21 and 22, and deformation of each stage unit of 21 and 22 can be decreased.

Figure 4A:
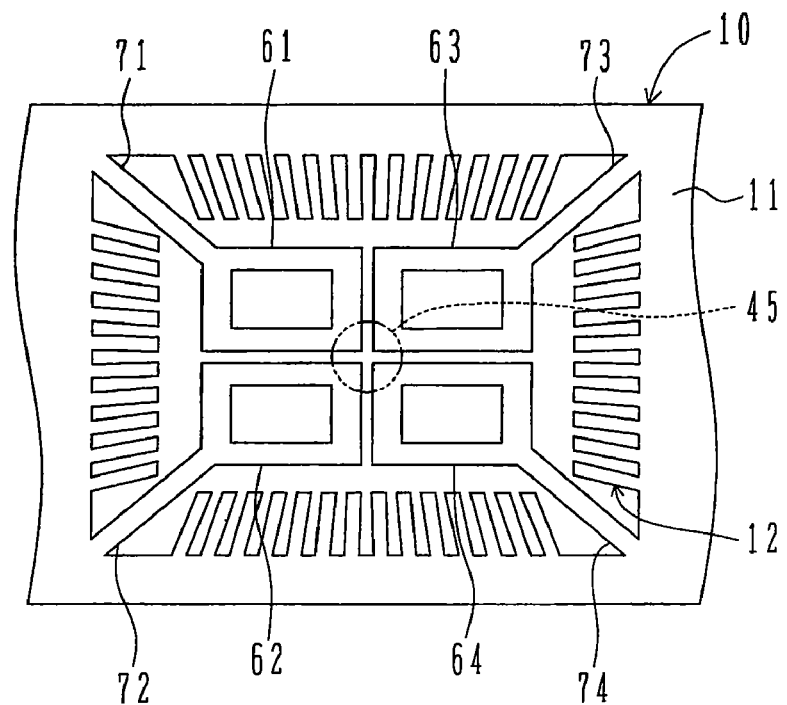
FIG. 4A and FIG. 4B are schematic views showing a lead frame according to a fourth embodiment of the present invention.
Figure 4B:
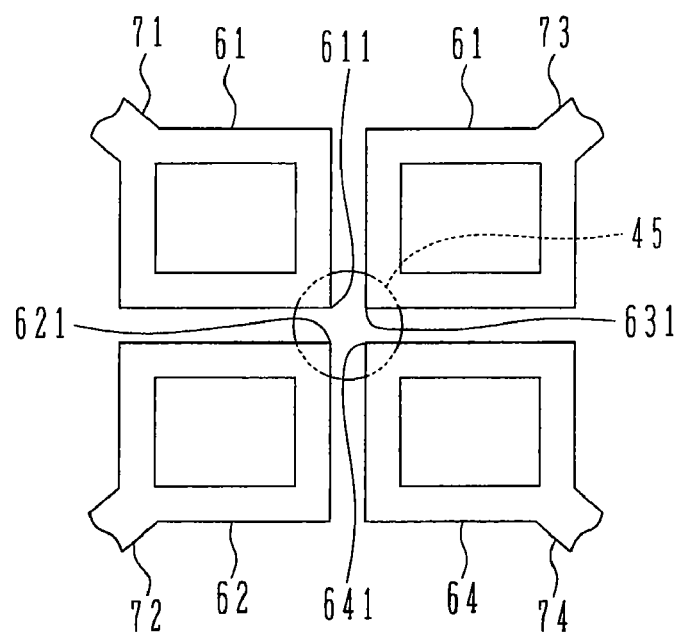

The lead frame according to the fourth embodiment of the present invention is shown in FIG. 4A and FIG. 4B.

In case of the fourth embodiment shown in FIG. 4A and FIG. 4B, the lead frame 10 equips with four stage units 61, 62, 63 and 64. The stage units 61 to 64 are respectively supported on the frame unit 11 by the supporting units 71, 72, 73 and 74. A connecting sticker as a connecting unit is formed in a round shape, and is adhered to include an angled part 611 of a stage unit 61, a angled part 621 of a stage unit 62, a angled part 631 of a stage unit 63 and a angled part 641 of a stage unit 64 as shown in FIG. 4B. By that, the connecting sticker 45 is adhered to the facing tips (angled parts) of the stage units 61, 62, 63 and 64.

The angled part 611 of the stage unit 61 is positioned at an edge part that is positioned at the opposing end of a diagonal line to a supporting unit 71 via the stage unit 61. As described in the above, the angled part 621 of the stage unit 62, the angled part 631 of the stage unit 63 and the angled part 641 of the stage unit 64 are positioned at edge parts which are respectively positioned at the opposing ends of the supporting units 72, 73 and 74 via the stage units 62, 63 or 64. The stage unit 61, the stage unit 62, the stage unit 63 and the stage unit 64 form a united stage unit by being adhered with the connecting sticker 45 and the angled parts 611, 621, 631 and 641 are covered by the connecting sticker 45; therefore, stress to be added on the connecting sticker 45 is decreased. Moreover, risk of peeling off of the connecting sticker 45 can be decreased.

Moreover, a space remains between each stage unit by adhering the connecting sticker 45 on the angled parts 611, 621, 631 and 641 of the stage units 61, 62, 63 and 64. Therefore, resin injected at the following packaging process flows through the space that is not adhered by the connecting sticker 45. By that, the connecting sticker 45 is hard to disturb the resin flow. Therefore, workability can be raised.

Figure 5A:
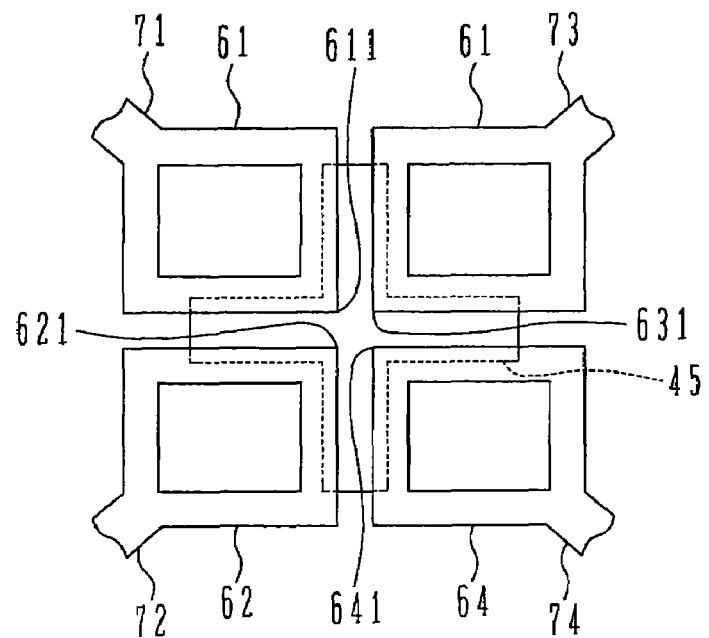
FIG. 5 is a schematic view showing a main part of a modified example of the lead frame according to the fourth embodiment of the present invention.
Figure 5B:
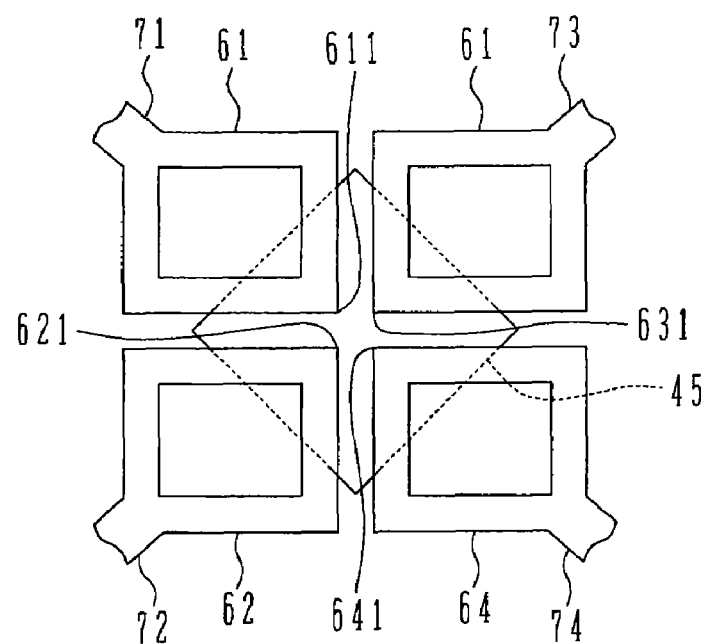

Moreover, the connecting sticker 45 can be adhered with covering the angled part 611, the angled part 621, the angled part 631 and the angled part 641 as shown in FIG. 4A and FIG. 4B. Therefore, the connecting sticker 45 is not limited to the round shape shown in FIG. 4A and FIG. 4B, but may be in shapes shown in FIG. 5A (a cross shape) or in FIG. 5B (a rectangle shape).

In addition to the above-described plurality of the embodiments, the embodiments may be modified in the following manners.

Figure 6A:
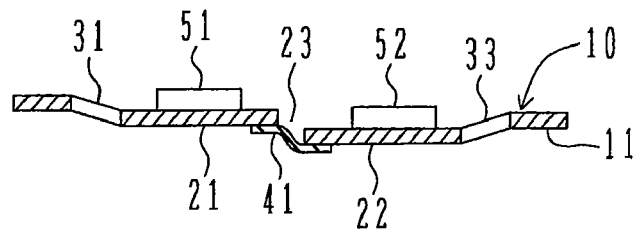
FIG. 6 is a schematic view showing a cross section of the lead frame according to other embodiment of the present invention.

In the above described plurality of the embodiments, the examples wherein the plurality of the stage units 21 and 22 are positioned approximately on the same plane have been explained. However, as shown in FIG. 6A, the stage unit 21 and the stage unit 22 may be positioned on different planes. In this case, the two stage units 21 and 22 are positioned on planes parallel to each other.

Figure 6B:
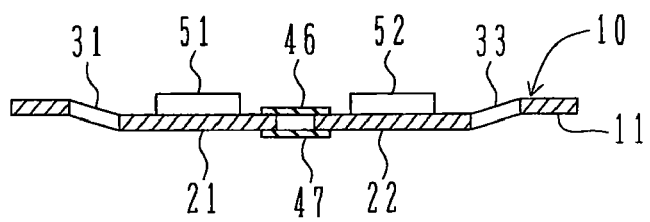

Moreover, as shown in FIG. 6B, the connecting tapes 46 and 47 connecting the stage unit 21 and the stage unit 22 may be adhered on the both surfaces of each of the stage units 21 and 22 instead of being adhered to the one surface.

Figure 6C:
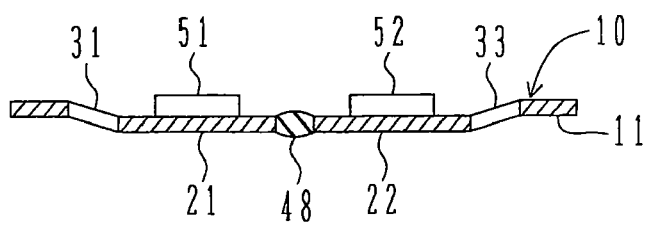

Moreover, as shown in FIG. 6C, the stage unit 21 and the stage unit 22 are connected with not only the connecting tape, but filling up adhering material 48. In this case, the adhering material 48 may be adhesive that hardens after filling up, or sticking material that keeps a semi-solid state.

Figure 6D:
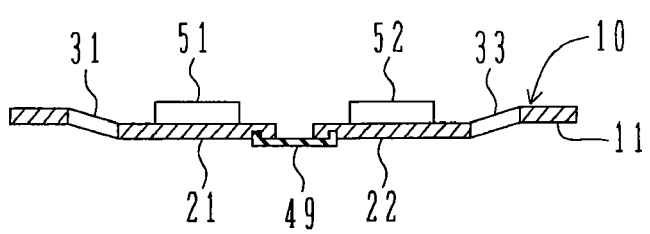

Moreover, as shown in FIG. 6D, a connecting material 49 may fix the stage unit 21 and the stage unit 22. The connecting material 49 is fixed on the stage unit 21 and the stage unit 22 by being inserted into a concavity formed on the stage unit 21 and the stage unit 22. Relative movements of the stage unit 21 and the stage unit 22 may be restricted by fixing the connecting material 49 on the stage unit 21 and the stage unit 22.

Figure 7A:
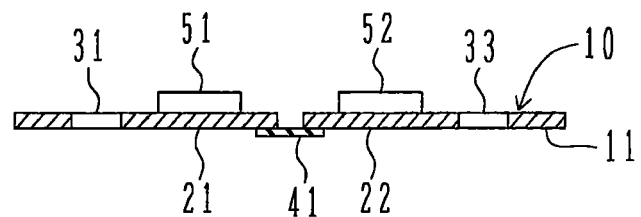
FIG. 7 is a schematic view showing a cross section of the lead frame according to other embodiment of the present invention.
Figure 7B:
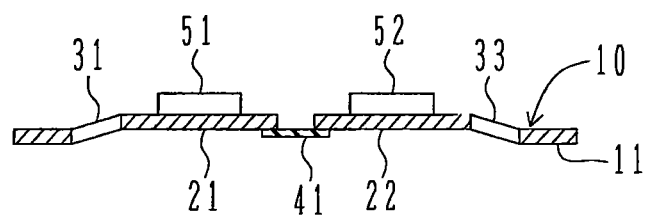
Figure 7C:
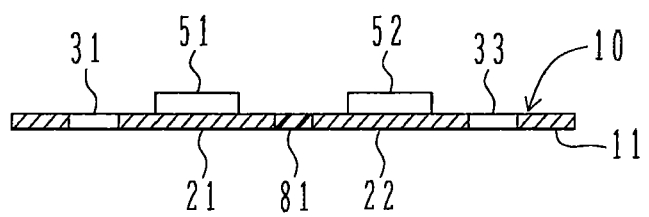
Figure 7D:
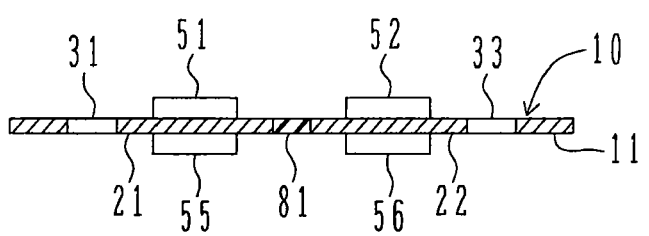

Moreover, as shown in FIG. 7A, it may be a flat-stage-typed lead frame 10 wherein the stage unit 21, the stage unit 22 and the frame unit 11 may be positioned on the same plane. As shown in FIG. 7B, it may be an up-set-typed lead frame 10 wherein the stage unit 21 and the stage unit 22 are positioned on the upper part than the frame unit 11. Furthermore, as shown in FIG. 7C, a connecting material 81 may be inserted between the stage unit 21 and the stage unit 22 of the flat-stage-typed lead frame 10. Moreover, as shown in FIG. 7D, the flat-stage typed lead frame 10 may be adopted, and the semiconductor chips 51, 52, 55 and 56 may be adhered on both upper and lower surfaces of the stage unit 21 and the stage unit 22. As described in the above, large number of the semiconductor chips may be mounted without causing large-sizing of the packaged semiconductor device by adhering the semiconductor chips 51, 52, 53 and 54 on both upper and lower surfaces of the stage unit 21 and the stage unit 22.

As described in the above, the positions of the stages unit and the shapes of the connecting materials may be arbitrary modified.

The present invention has been described in connection with the preferred embodiments. The invention is not limited only to the above embodiments. It is apparent that various modifications, improvements, combinations, and the like can be made by those skilled in the art.

What are claimed are:

1. A leadframe, comprising:
   a plurality of stage units formed in an area that forms a single semiconductor package, the plurality of stage units being formed separately from each other and are arranged on a same plane or on planes in parallel;
   a frame unit that is arranged around the stage units, and forms a frame for the single semiconductor package;
   a support unit that connects the stage units with the frame unit and supports the stage units with the frame unit; and
   a connecting unit that is formed of insulating material and connects the stage units between the stage units, wherein the connecting unit comprises a connecting tape.

2. The leadframe according to claim 1, wherein the connecting unit comprises an adhering part and is adhered to the stage units with the adhering part.

3. The leadframe according to claim 2, wherein the connecting unit is adhered to a part including an angled part of each of opposing stage units.

4. The leadframe according to claim 3, wherein the connecting unit is adhered to an edge part opposing to the support unit on a diagonal line of each stage unit.

5. The leadframe according to claim 1, wherein the connecting unit is fixed to the stage units.

\* \* \* \* \*